United States Patent
Hortaleza et al.

(10) Patent No.: US 7,061,114 B2
(45) Date of Patent: Jun. 13, 2006

(54) STRUCTURE AND METHOD FOR CONTACT PADS HAVING A PROTECTED BONDABLE METAL PLUG OVER COPPER-METALLIZED INTEGRATED CIRCUITS

(75) Inventors: Edgardo R. Hortaleza, Garland, TX (US); Lei Li, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 78 days.

(21) Appl. No.: 10/811,124

(22) Filed: Mar. 25, 2004

(65) Prior Publication Data

US 2005/0224984 A1 Oct. 13, 2005

(51) Int. Cl.
*H01L 23/48* (2006.01)

(52) U.S. Cl. .................................................... 257/762

(58) Field of Classification Search ............... None
See application file for complete search history.

(56) References Cited

U.S. PATENT DOCUMENTS

| | | | |
|---|---|---|---|
| 5,734,200 A * | 3/1998 | Hsue et al. ................. 257/755 |
| 6,251,694 B1 * | 6/2001 | Liu et al. ..................... 438/14 |
| 6,737,745 B1 * | 5/2004 | Sabin et al. ................. 257/758 |
| 2003/0030153 A1 * | 2/2003 | Perry ......................... 257/782 |

\* cited by examiner

*Primary Examiner*—Leonardo Andujar
(74) *Attorney, Agent, or Firm*—Yingsheng Tung; Wade James Brady, III; Frederick J. Telecky, Jr.

(57) ABSTRACT

An integrated circuit having copper interconnecting metallization (311, 312) protected by a first, inorganic overcoat layer (320), portions of the metallization exposed in windows (301, 302) opened through the thickness of the first overcoat layer. A patterned conductive barrier layer (330) is positioned on the exposed portion of the copper metallization and on portions of the first overcoat layer surrounding the window. A bondable metal layer (350, 351) is positioned on the barrier layer; the thickness of this bondable layer is suitable for wire bonding. A second, organic overcoat layer (360) is surrounding the window so that the surface (360a) of this second overcoat layer at the edge of the window is at or above the surface (350a) of the bondable layer. The second overcoat layer may be spaced (370) from the edge of the bondable metal layer.

18 Claims, 4 Drawing Sheets

STRUCTURE AND METHOD FOR CONTACT PADS HAVING A PROTECTED BONDABLE METAL PLUG OVER COPPER-METALLIZED INTEGRATED CIRCUITS

FIELD OF THE INVENTION

The present invention is related in general to the field of electronic systems and semiconductor devices and more specifically to bond pad structures and fabrication methods of copper metallized integrated circuits.

DESCRIPTION OF THE RELATED ART

In integrated circuits (IC) technology, pure or doped aluminum has been the metallization of choice for interconnection and bond pads for more than four decades. Main advantages of aluminum include easy of deposition and patterning. Further, the technology of bonding wires made of gold, copper, or aluminum to the aluminum bond pads has been developed to a high level of automation, miniaturization, and reliability.

In the continuing trend to miniaturize the ICs, the RC time constant of the interconnection between active circuit elements increasingly dominates the achievable IC speed-power product. Consequently, the relatively high resistivity of the interconnecting aluminum now appears inferior to the lower resistivity of metals such as copper. Further, the pronounced sensitivity of aluminum to electromigration is becoming a serious obstacle. Consequently, there is now a strong drive in the semiconductor industry to employ copper as the preferred interconnecting metal, based on its higher electrical conductivity and lower electromigration sensitivity. From the standpoint of the mature aluminum interconnection technology, however, this shift to copper is a significant technological challenge.

Copper has to be shielded from diffusing into the silicon base material of the ICs in order to protect the circuits from the carrier lifetime killing characteristic of copper atoms positioned in the silicon lattice. For bond pads made of copper, the formation of thin copper(I)oxide films during the manufacturing process flow has to be prevented, since these films severely inhibit reliable attachment of bonding wires, especially for conventional gold-wire ball bonding. In contrast to aluminum oxide films overlying metallic aluminum, copper oxide films overlying metallic copper cannot easily be broken by a combination of thermocompression and ultrasonic energy applied in the bonding process. As further difficulty, bare copper bond pads are susceptible to corrosion.

In order to overcome these problems, the semiconductor industry adopted a structure to cap the clean copper bond pad with a layer of aluminum and thus re-construct the traditional situation of an aluminum pad to be bonded by conventional gold-wire ball bonding. The described approach, however, has several shortcomings. First, the fabrication cost of the aluminum cap is higher than desired, since the process requires additional steps for depositing metal, patterning, etching, and cleaning. Second, the cap must be thick enough to allow reliable wire bonding and to prevent copper from diffusing through the cap metal and possibly poisoning the IC transistors.

Third, the aluminum used for the cap is soft and thus gets severely damaged by the markings of the multiprobe contacts in electrical testing. This damage, in turn, becomes so dominant in the ever decreasing size of the bond pads that the subsequent ball bond attachment is no longer reliable. Finally, the elevated height of the aluminum layer over the surrounding overcoat plane enhances the risk of metal scratches and smears. At the tight bond pad pitch of many high input/output circuits, any aluminum smear represents an unacceptable risk of shorts between neighbor pads.

SUMMARY OF THE INVENTION

A need has therefore arisen for a metallurgical bond pad structure suitable for ICs having copper interconnection metallization which combines a low-cost method of fabricating the bond pad structure, a perfect control of up-diffusion, a risk elimination of smearing or scratching, and a reliable method of bonding wires to these pads. The bond pad structure should be flexible enough to be applied for different IC product families and a wide spectrum of design and process variations. Preferably, these innovations should be accomplished while shortening production cycle time and increasing throughput, and without the need of expensive additional manufacturing equipment.

One embodiment of the invention is an integrated circuit, which has copper interconnecting metallization protected by a first overcoat layer. A portion of this metallization is exposed in a window opened through the thickness of the first overcoat layer. A patterned conductive barrier layer is positioned on the exposed portion of the copper metallization and on portions of the first overcoat layer surrounding the window. A bondable metal layer is positioned on the barrier layer; the thickness of this bondable layer is suitable for wire bonding. A second overcoat layer is surrounding the window so that the surface of this second overcoat layer at the edge of the window is at of above the surface of the bondable layer. The second overcoat layer may be spaced from the edge of the bondable metal layer.

For the first overcoat layer, practically moisture-impenetrable materials such as silicon nitride or oxynitride are preferred; for the second overcoat layer, organic materials such as polyimide or benzocyclobutene.

Another embodiment of the invention is a wafer-level method of fabricating a metal structure for a contact pad of an integrated circuit, which has copper interconnecting metallization and is protected by a first overcoat layer, including insulating silicon compounds. The method comprises the steps of opening a window through the thickness of the first overcoat layer to expose portions of the copper metallization. A barrier metal layer is then deposited over the wafer including the exposed copper metallization and first overcoat surface. Next, a bondable metal layer (preferably aluminum) is deposited over the barrier layer in a thickness sufficient to fill the overcoat window and to enable wire ball bonding. Next, both deposited metal layers are patterned so that only the layer portions inside the window and over a first overcoat area close to the window remain. A second, organic-based overcoat layer is then deposited over the wafer, in a thickness greater than the combined thicknesses of the barrier and bondable metal layers. Selectively, this second overcoat layer is removed from the bondable metal layer to expose the bondable metal for the process of wire bonding.

Embodiments of the present invention are related to wire-bonded IC assemblies, semiconductor device packages, surface mount and chip-scale packages. It is a technical advantage that the invention offers a low-cost method of reducing the risk of aluminum-smearing or -scratching and electrical shorting between contact pads. The assembly yield of high input/output devices can thus be significantly improved. It is an additional technical advantage that the invention facilitates the shrinking of the pitch of chip contact pads without the risk of yield loss due to electrical shorting. Further technical advantages include the opportunity to scale the assembly to smaller dimensions, supporting the ongoing trend of IC miniaturization.

The technical advantages represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
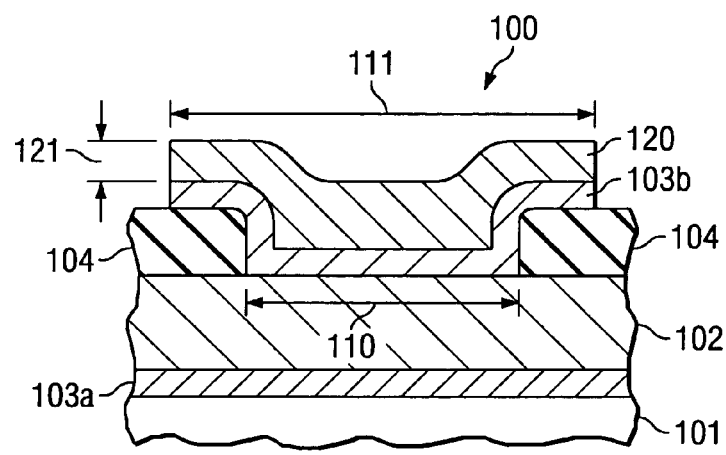
FIG. 1 depicts a schematic cross section of a contact pad of an integrated circuit (IC) with copper metallization according to known technology. The bondable metal is added as an additional layer elevated over the wafer surface.

The technical advantages offered by the invention can be best appreciated by comparing an embodiment of the invention with the conventional method of wire-bonding a contact pad of an integrated circuit (IC) chip, which uses copper as interconnecting metal. An example of a conventional structure is depicted in FIG. 1. In the schematic cross section of an IC contact pad generally designated 100, 101 is an intra-level dielectric, which may consist of silicon dioxide, a low-k dielectric, or any other suitable insulator customarily used in ICs. 102 represents the top level IC copper metallization (thickness typically between 200 and 500 nm, contained by barrier layers 103a and 103b (typically tantalum nitride, typically 10 to 30 nm thick) from diffusing into other IC materials. In the essentially moisture-impermeable overcoat layer 104 (typically between 500 to 1000 nm of silicon nitride, silicon oxynitride, or silicon dioxide, single-layered or multi-layered) is contact window 110, usually between 40 to 70 μm wide, which exposed the copper metallization 102 for establishing a contact. Barrier layer 103b overlaps overcoat 104 around the window perimeter to create a metallization width 111, which is thus larger than window 110 (typically about 45 to 75 μm diameter). The same width 111 holds for the bondable metal layer 120, which is aluminum or a copper-aluminum alloy. For reliable wire bonding, layer 120 has typically a thickness 121 between 700 and 1000 nm.

This considerable height 121 of the patterned aluminum layer 120 represents a substantial risk for accidental scratching or smearing of the aluminum. There are numerous wafer and chip handling steps in a typical assembly process flow after the aluminum patterning. The most important steps include back-grinding; transporting the wafer from the fab to the assembly facility; placing the wafer on a tape for sawing; sawing and rinsing the wafer; attaching each chip onto a leadframe; wire bonding; and encapsulating the bonded chip in molding compound. At each one of these process steps, and between the process steps, accidental scratching or smearing could happen.

Figure 2:
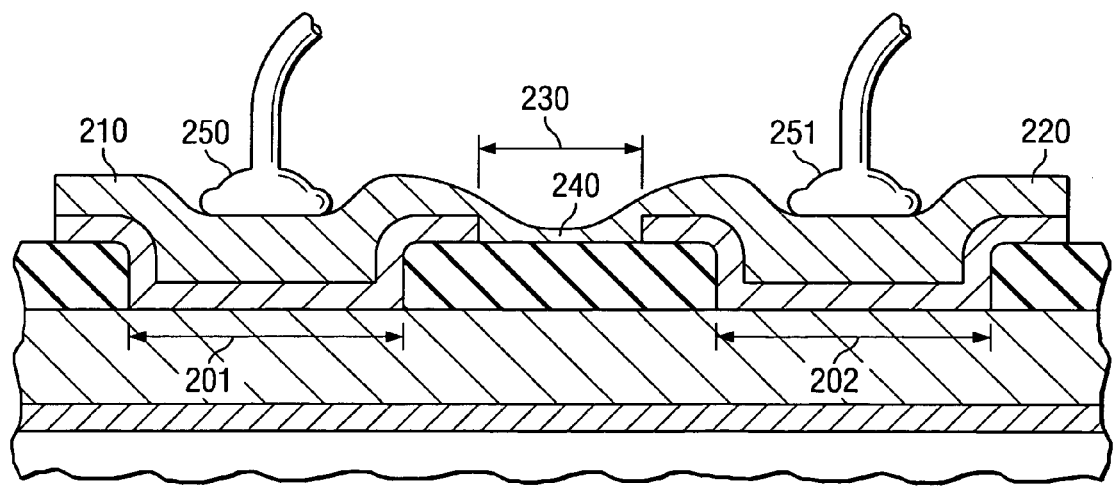
FIG. 2 illustrates a schematic cross section of two wire-bonded contact pads of a copper-metallized IC in known technology. The elevated bondable metal layers have been scratched and smeared, causing an electrical short.

An example is schematically indicated in FIG. 2, which is a cross section through two bonding pads 201 and 202 in close proximity (distance 230). The aluminum layer 210 of pad 201 and the aluminum layer 220 of pad 202 have been scratched so that the aluminum is smeared together at 240. As a consequence, the pads of bonds 250 and 251 form an electrical short.

Figure 3A:
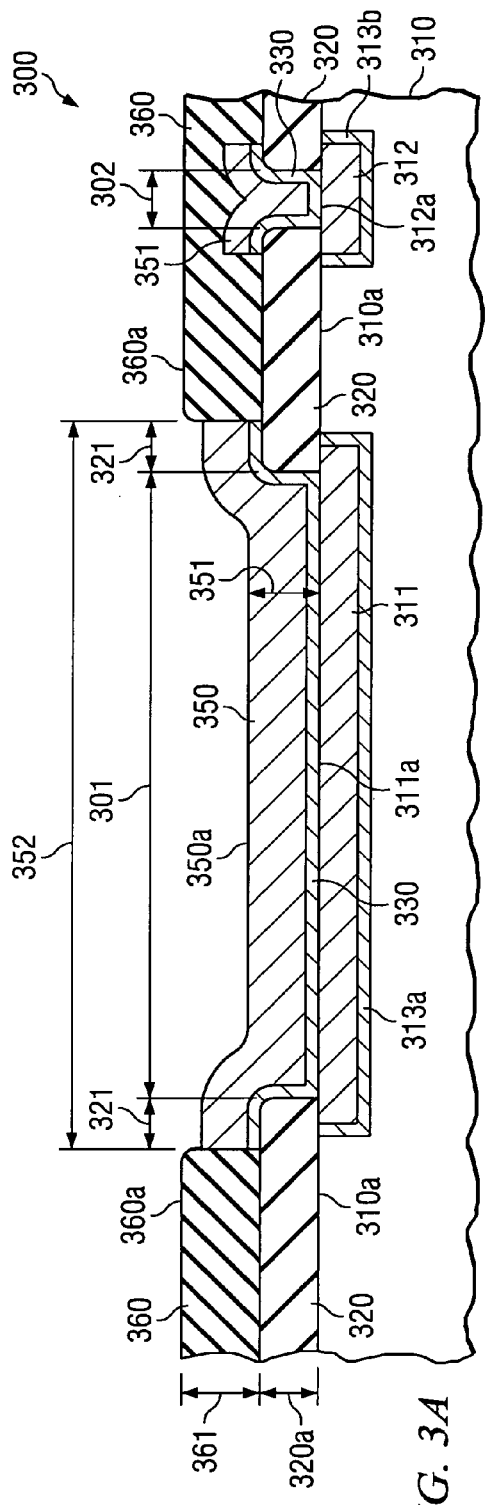
FIG. 3A is a schematic cross section of an embodiment of the invention depicting a contact pad of an IC with copper metallization, wherein the contact pad has a bondable metal plug closely surrounded by a second protective overcoat.

An embodiment of the invention is shown in FIG. 3A, illustrating a schematic cross section of a portion 300 of a semiconductor wafer. The interlevel insulating material 310 is made, for instance, of low-k dielectric material, silicon dioxide, or a stack of dielectric materials. The dielectric material 310 is covered by a first protective overcoat 320. Preferred overcoat materials are practically moisture impermeable or moisture retaining, and mechanically hard; examples include one or more layers of silicon nitride, silicon oxynitride, silicon carbide, or a stack of insulating materials including polyimide. The overcoat has a thickness 320a in the range from 0.5 to 1.5 μm, preferably 1.0 μm. Windows 301 and 302 in the overcoat are opened to reach the top layer of the interconnecting metallization, for purposes of a bond pad and the scribe street, respectively.

FIG. 3A further shows portions of the patterned top layer of the IC interconnecting metallization made of copper or a copper alloy, embedded in insulator 310. Illustrated is specifically the portion 311 of the copper layer intended to provide a contact pad, and portion 312 intended to anchor the scribe street. The thickness of the copper layer is preferably in the range from 0.2 to 0.5 μm. The copper metallization is contained by barrier layer 313a, and 113b respectively, from diffusing into insulator 310 or other integrated circuit materials; barrier layers 313a and 313b are preferably made of tantalum nitride and about 10 to 30 nm thick. The bond pad copper layer 311 has a width 301 (typically in the range from 30 to 60 μm).

In order to establish low-resistance ohmic contact to the copper, one or more conductive barrier layers 330 are deposited over the copper, as indicated in FIG. 3A. For a single layer, tantalum nitride is the preferred selection. For a couple of layers, the first barrier layer is preferably selected from titanium, tantalum, tungsten, molybdenum, chromium and alloys thereof; the layer is deposited over the exposed copper 311 with the intent to establish good ohmic contact to the copper by "gettering" the oxide away from the copper. A second barrier layer, commonly nickel vanadium, is deposited to prevent outdiffusion of copper. The barrier layer has a thickness preferably in the range from 0.02 to 0.03 μm.

On top of the barrier layer 330 is a layer 350 of bondable metal, which has a thickness suitable for wire ball bonding. The preferred thickness ranges from about 0.4 to 1.4 μm. Because of this considerable thickness, layer 350 is often referred to as a plug. The bondable metal is preferably aluminum or an aluminum alloy, such as aluminum-copper alloy. In FIG. 3A, the exposed surface of this plug is designated 350a. An aluminum layer 351 of the same thickness is shown in FIG. 3A over the scribe street metal 312.

As FIG. 3A indicates, the exposed surface (top surface) 311a of copper layer 311, and exposed surface (top surface) 312a of the scribe street metallization are at the same level as the top surface 310a of the dielectric material 310. The reason for this uniformity is the method of fabrication involving a chemical-mechanical polishing step.

Since the surfaces 310a and 311a are on a common level, the combined thicknesses of barrier layer 330 and bondable plug 350 stick out geometrically above this common level; in FIG. 3A, this combined height above the level is designated 351. Furthermore, after patterning the barrier layer 330 and bondable layer 350, both layers typically overlap the edges of the window in the first protective overcoat 320 by a distance 321 around the perimeter of window 301. Typically, distance 321 is between about 0.1 and 0.3 μm. Elevated by the thickness 320a of the first overcoat, the combined layer height 351 thus becomes exposed on the surface of first overcoat 320. In FIG. 3A, the diameter of the complete area covered by the bondable plug is designated 352.

Figure 3B:
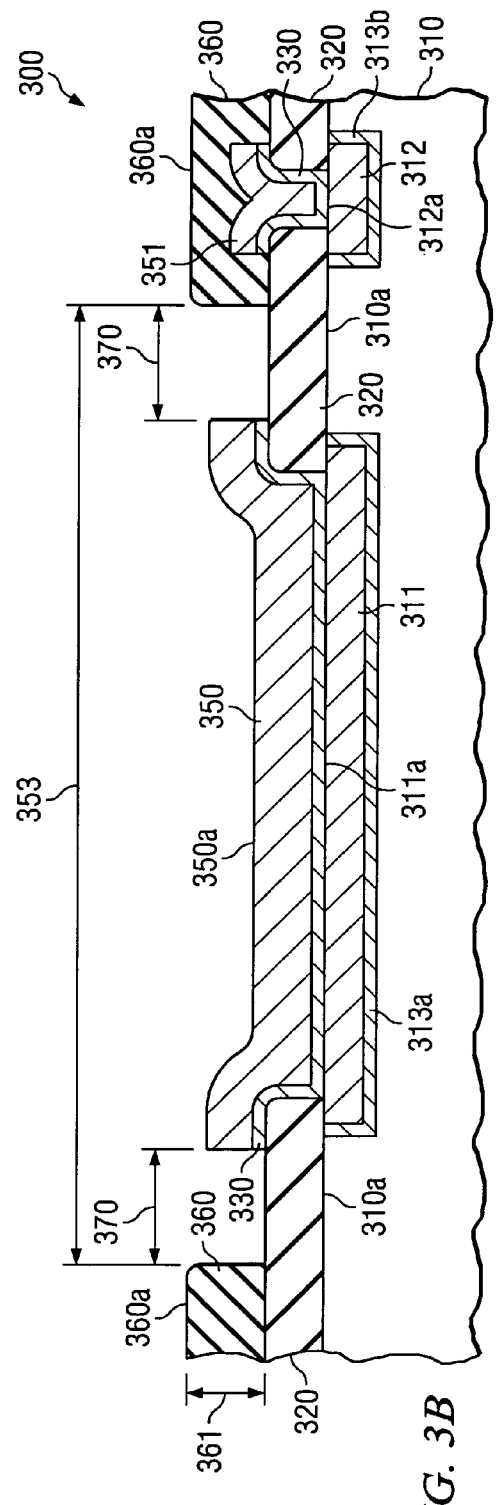
FIG. 3B is a schematic cross section of another embodiment of the invention depicting a contact pad of an IC with copper metallization, wherein the contact pad has a bondable metal plug loosely surrounded by a second protective overcoat.

In order to protect the exposed thickness of the combined layers 350 and 330, a second overcoat layer 360 surrounds the plug area over window 301. The second overcoat layer is an organic material selected from a group consisting of polyimide, benzocyclobutene, and related polymeric compounds. The organic overcoat material is light sensitive in order to facilitate the patterning step of the overcoat without resorting to a photoresist methodology. The opening of this second overcoat has about the diameter 352 of the overall plug (as shown in FIG. 3A), or a somewhat larger diameter 353 (as shown in FIG. 3B). The larger diameter 353, compared to diameter 352, is caused by the distance 370 between the edge of plug 350 and the edge of second overcoat 360. For many devices, distance 370 is between about 3 and 6 μm; for other devices it is between about 2 and 10 μm; it may also be larger without loosing the effectiveness of scratch protection. Distance 370 is in principle determined by the depth of focus of the optical equipment used in the patterning step. The thickness 361 of second overcoat layer 360 determines its surface 360a. The surface 360a of second overcoat layer 360 at the edge of the window is at or above the surface 350a of the bondable layer. The thickness 361 of second overcoat 360 is usually between about 0.5 and 5 μm, preferably between 3 and 4 μm.

In the device example of FIGS. 3A and 3B, the bondable metal 351 over the scribe street metallization is shown covered by second overcoat 360. The main reason for this coverage is the proximity of the scribe street to the edge of the bondable metal 350 over the bond pad. In devices having a wider separation of scribe street and nearest bond pad, the second overcoat over the scribe street is optional, since the second overcoat will be positioned the space between the scribe street and the bond pad edge.

Figure 4:
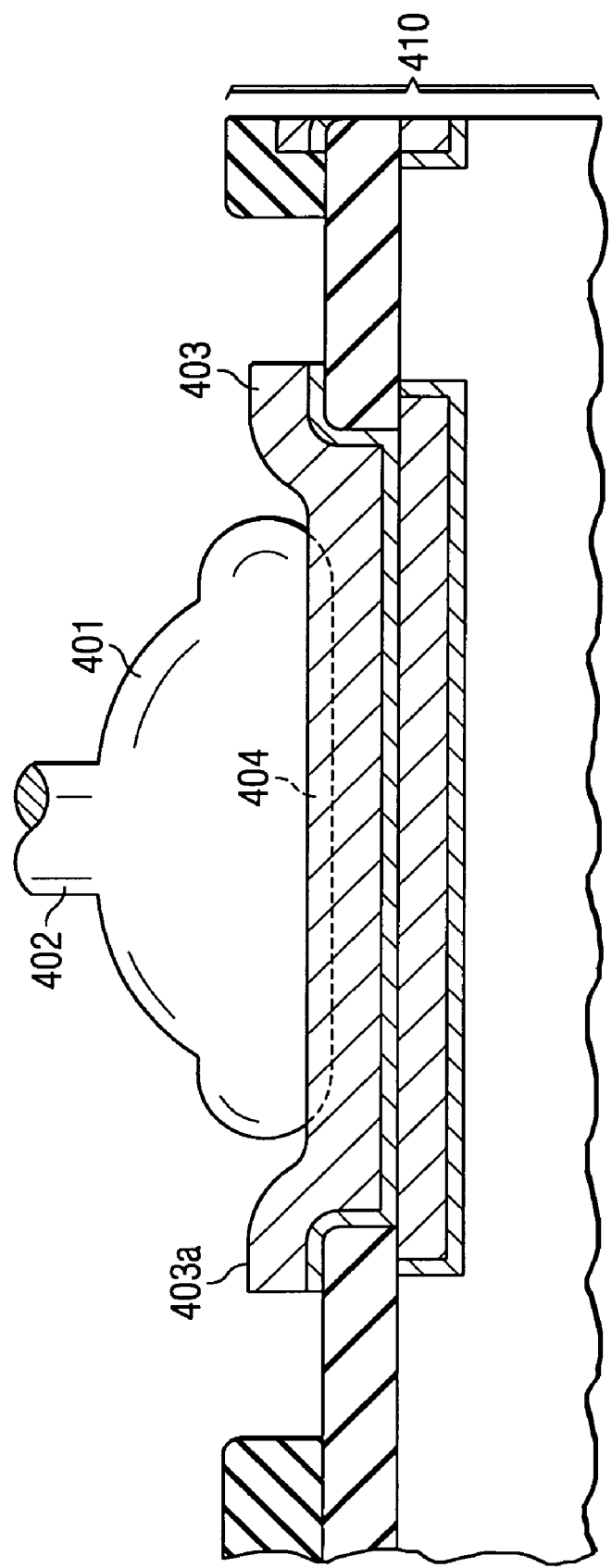
FIG. 4 is a schematic cross section of the bond pad metallization according to the invention, with a ball bond attached to the bondable metal plug.

The cross section of FIG. 4 illustrates schematically the contact pad of FIG. 3B after the chip has been singulated from the wafer in a sawing process (scribe street indicated by 410) and a ball bond has been attached. A free air ball 401 (preferably gold) of a metal wire 402 (preferably gold) is pressure-bonded to the undisturbed surface 403a of the plug 403 (preferably aluminum or an aluminum alloy). In the bonding process, intermetallic compounds 404 are formed in the contact region of ball and plug; the intermetallic compounds may actually consume most of the aluminum under the gold ball.

Figure 5:
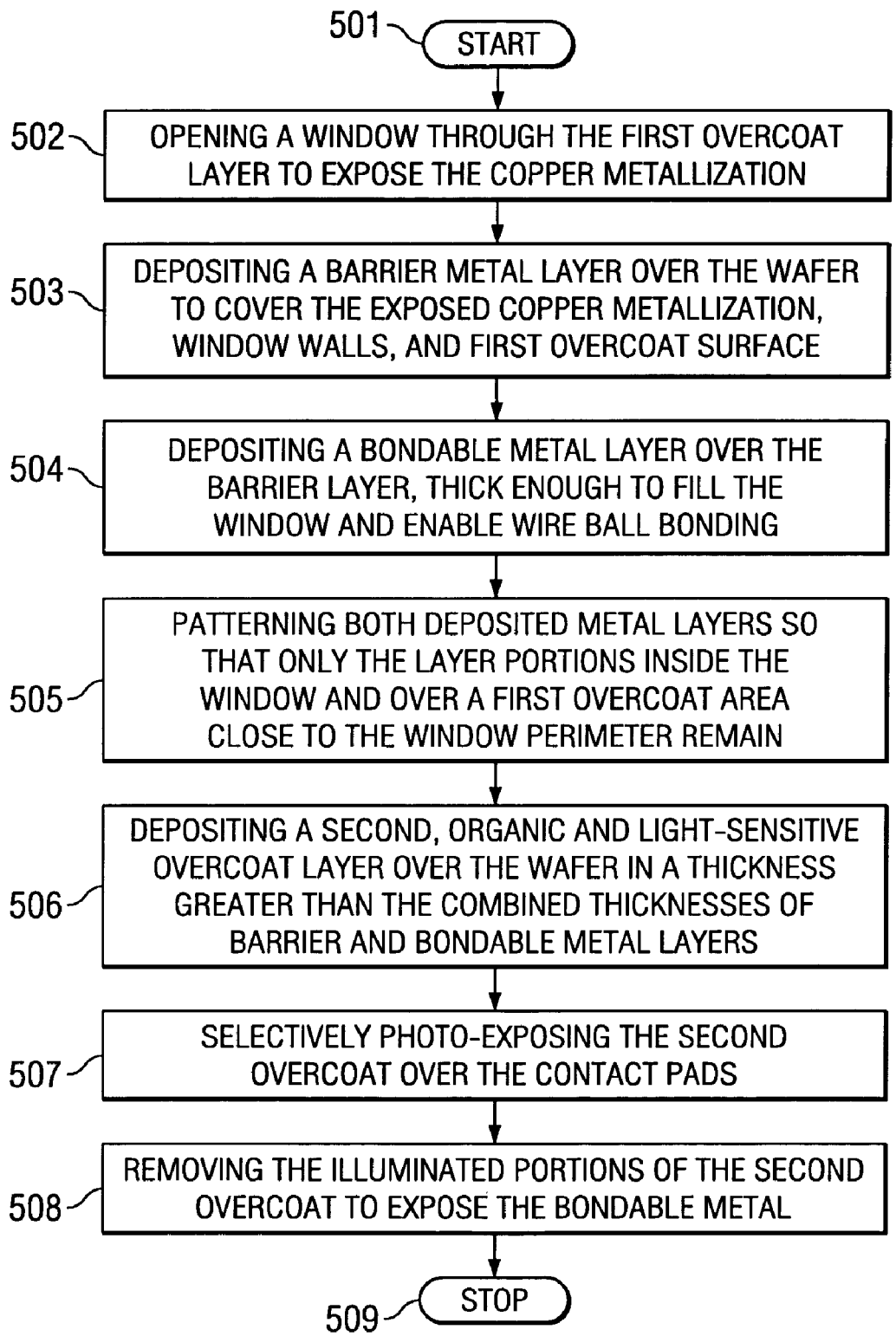
FIG. 5 is a block diagram of the device fabrication process flow according to another embodiment of the invention.

Another embodiment of the invention is a wafer-level method of fabricating a metal structure for a contact pad of an integrated circuit, which has copper interconnecting metallization. The wafer is protected by a first overcoat layer, which includes inorganic compounds such as silicon nitride for mechanical and moisture protection. The process flow is displayed in the schematic block diagram of FIG. 5. The method, starting at step 501, opens a window in the first overcoat layer at step 502 in order to expose portions of the copper metallization. The window has walls reaching through the thickness of the first overcoat layer.

In the next process step 503, a barrier metal layer is deposited over the wafer. Preferred barrier metal choices include tantalum or tantalum nitride, and nickel vanadium. Inside the window, this conductive barrier metal layer covers the exposed copper metallization and the window walls; outside the window, the barrier layer covers the first overcoat surface. In step 504, a bondable metal layer is deposited over the barrier layer in a thickness sufficient to fill the overcoat window and to enable wire ball bonding. Preferred bondable metal choices include aluminum and aluminum alloy.

In the next process step 505, both deposited metal layers are patterned so that only the layer portions inside the window and over a first overcoat area close to the window perimeter remain.

In step 506, a second, organic overcoat layer is deposited over the wafer. Preferred materials include benzocyclobutene, polyimide, and related polymeric compounds. The materials should photosensitive in order to facilitate the patterning process. The second overcoat layer has a thickness greater than the combined thicknesses of the barrier and the bondable metal layers. The preferred deposition process is a spin-on method (which is low cost).

In step 507, a photomask is applied so that the contact pad areas can be exposed to light. The outlines of the exposed areas are determined by the depth of focus of the optical equipment; the alignment of the photomask is, therefore, a process step with significant tolerance. This method step is thus a technical advantage and a low cost process step. Based on this process step using the depth of focus, a distance can be created which separates the edge of the remaining second overcoat from the edge of the bondable metal. This distance is preferably only few micrometers wide and does thus not diminish the protective function of the second overcoat against accidental scratches; it rather adds process flexibility.

The method concludes at step 509.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the fabrication method can be modified so that the second overcoat located over the scribe lines is removed in the same process step as the overcoat removal over the bondable metal. This will alleviate the scribing of the wafer in the dicing or sawing operation.

As another example, the polymer material of the second overcoat can be selected so that it supports the absorption of alpha radiation or other external chip bombardment, which is known to initiate soft error failures in semiconductor devices, especially dynamic memories.

It is therefore intended that the appended claims encompass any such modifications and embodiments.

We claim:

1. An integrated circuit having copper interconnecting metallization protected by a first overcoat layer, portions of said metallization exposed in a window opened through the thickness of said first overcoat layer, comprising:
   a patterned conductive barrier layer positioned on said exposed portion of said copper metallization and on portions of said first overcoat layer surrounding said window;
   a bondable metal layer positioned on said barrier layer, the thickness of said bondable layer suitable for wire bonding; and
   a second overcoat layer disposed on the integrated circuit having an opening exposing the bondable metal layer and a portion of the first overcoat layer.

2. The circuit according to claim 1 wherein said first overcoat thickness is from about 0.6 to 1.5 µm.

3. The circuit according to claim 1 wherein said first overcoat comprises one or more layers of silicon nitride, silicon oxynitride, silicon dioxide, silicon carbide, or other moisture-retaining compounds.

4. The circuit according to claim 1 wherein said barrier layer comprises tantalum nitride.

5. The circuit according to claim 1 wherein said barrier layer is selected from a group consisting of tantalum, titanium, tungsten, molybdenum, chromium, vanadium, alloys thereof, stacks thereof, and chemical compounds thereof.

6. The circuit according to claim 1 wherein said barrier layer has a thickness between about 0.02 and 0.03 µm.

7. The circuit according to claim 1 wherein said bondable metal is aluminum or an aluminum alloy.

8. The circuit according to claim 1 wherein said bondable metal layer has a thickness suitable for wire bonding.

9. The circuit according to claim 8 wherein said bondable metal layer has a thickness between about 0.4 and 1.4 µm.

10. The circuit according to claim 1 further comprising a ball bond attached to the bondable layer.

11. The circuit according to claim 1 wherein said barrier and bondable metal layers overlap between about 0.1 and 0.3 µm over said surrounding portions of said first overcoat layer.

12. The circuit according to claim 1 wherein said second overcoat layer is an organic material selected from a group consisting of polyimide, benzocyclobutene, and related polymeric compounds.

13. The circuit according to claim 1 wherein said second overcoat layer has a thickness between about 0.5 and 5.0 µm.

14. The circuit according to claim 1 further comprising a distance separating the edge of said second overcoat and the edge of said combined barrier and bondable metal layers.

15. The circuit according to claim 14 wherein said distance is between about 3 and 6 µm.

16. A wafer-level method of fabricating a metal structure for a contact pad of an integrated circuit having copper interconnecting metallization protected by a first overcoat layer including insulating silicon compounds, comprising the steps of:
   opening a window through the thickness of said first overcoat layer to expose portions of said copper metallization;
   depositing a barrier metal layer over said wafer to cover said exposed copper metallization and first overcoat surface;
   depositing a bondable metal layer over said barrier layer in a thickness sufficient to fill said overcoat window and to enable wire ball bonding;
   patterning both said deposited metal layers so that only the layer portions inside the window and over a first overcoat area close to the window perimeter remain;
   depositing a second, organic, light-sensitive overcoat layer over said wafers; and
   patterning the second overcoat to open a window through the thickness of the second overcoat layer to expose a portion of the first overcoat and the bondable metal layer.

17. The method according to claim 16 wherein said step of depositing said second overcoat layer comprises a spin-on process.

18. The method according to claim 16 said second overcoat is an organic material selected from a group consisting of polyimide, benzocyclobutene, and related polymeric compounds.

* * * * *